United States Patent
Chen et al.

(10) Patent No.: US 11,514,979 B2
(45) Date of Patent: Nov. 29, 2022

(54) WORDLINE DRIVER ARCHITECTURE

(71) Applicant: Arm Limited, Cambridge (GB)

(72) Inventors: Andy Wangkun Chen, Austin, TX (US); Munish Kumar, Noida (IN); Ayush Kulshrestha, New Delhi (IN); Rajiv Kumar Sisodia, Bangalore (IN); Yew Keong Chong, Austin, TX (US); Kumaraswamy Ramanathan, Austin, TX (US); Edward Martin McCombs, Jr., Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/218,949

(22) Filed: Mar. 31, 2021

(65) Prior Publication Data
US 2022/0319585 A1 Oct. 6, 2022

(51) Int. Cl.
*G11C 8/00* (2006.01)
*G11C 11/418* (2006.01)
*G11C 11/16* (2006.01)

(52) U.S. Cl.
CPC ........ *G11C 11/418* (2013.01); *G11C 11/1657* (2013.01)

(58) Field of Classification Search
CPC .................................................. G11C 11/1657
USPC ........................................................ 365/230.06
See application file for complete search history.

(56) References Cited

U.S. PATENT DOCUMENTS

| | | | | |
|---|---|---|---|---|
| 5,717,649 A | * | 2/1998 | Kim | G11C 8/08 365/230.06 |
| 5,781,497 A | * | 7/1998 | Patel | G11C 8/08 365/189.11 |
| 2010/0214859 A1 | * | 8/2010 | Behrends | G11C 8/08 365/230.06 |

* cited by examiner

*Primary Examiner* — Hoai V Ho
(74) *Attorney, Agent, or Firm* — Pramudji Law Group PLLC; Ari Pramudji

(57) ABSTRACT

Various implementations described herein are related to a device with a wordline driver that provides a wordline signal to a wordline based on a row selection signal and a row clock signal. The device may have row selector logic that provides the row selection signal to the wordline driver based on first input signals in a periphery voltage domain. The device may also have level shifter circuitry that provides the row clock signal to the wordline driver in a core voltage domain based on second input signals in the periphery voltage domain.

17 Claims, 12 Drawing Sheets

WORDLINE DRIVER ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern designs, conventional memory circuits typically involve the use of power-gated power supplies. However, these conventional memory circuits can exhibit constant power leakage due to limited cut-off capability of power-gated transistors, which can lead to leaking DC paths when the wordline is high. Unfortunately, wordline rise time can be negatively affected due to leaking DC current. As such, there exists a need to improve wordline driver designs in various memory related applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
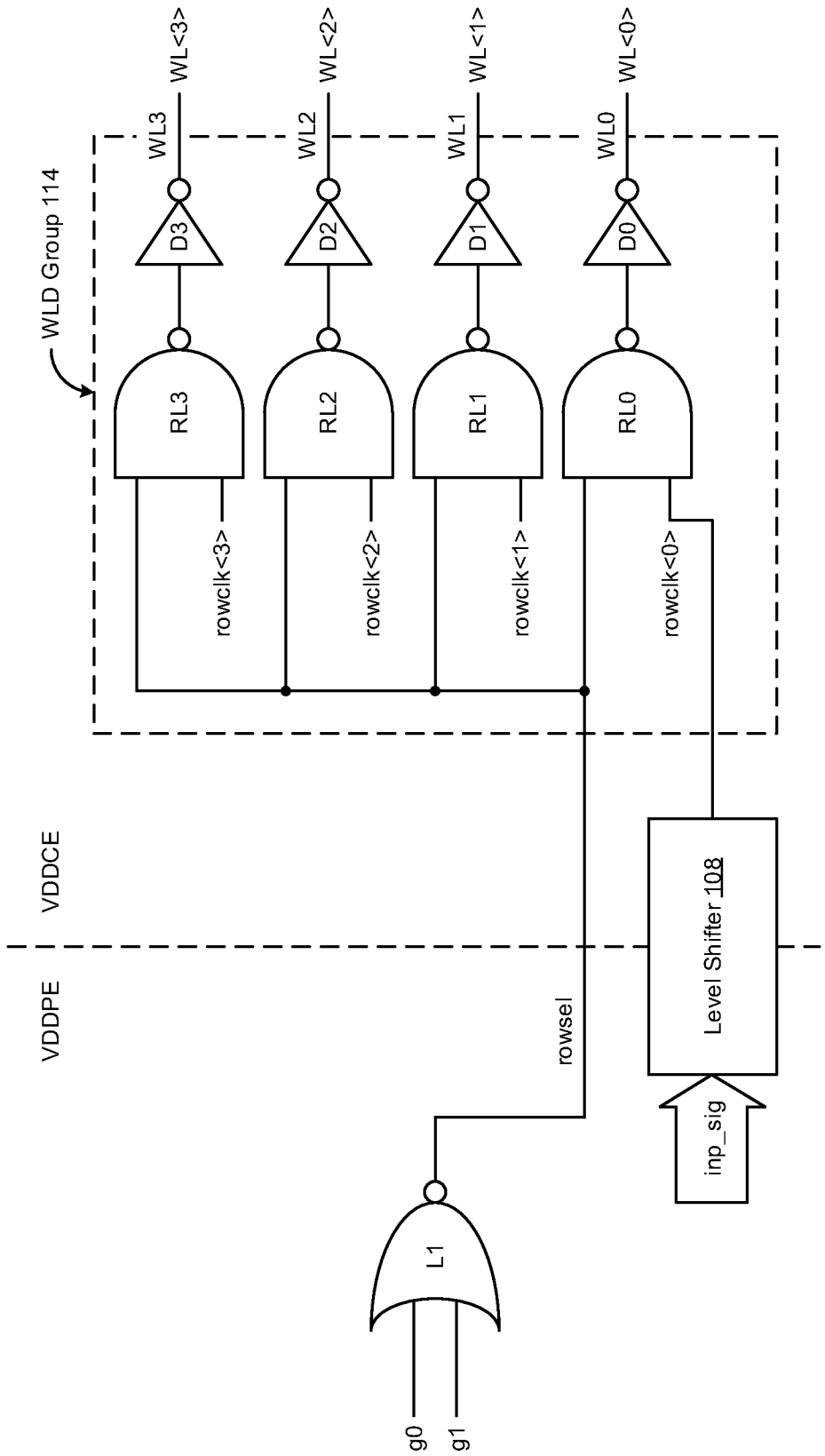
FIG. 1 illustrates a diagram of wordline driver architecture in accordance with various implementations described herein.

Various implementations described herein are associated with various wordline driver schemes and techniques for various memory related applications in physical circuit layout designs. Also, in some embodiments, various schemes and techniques described herein may provide for robust wordline driver architecture that may be used to implement a programmable high-speed wordline level-shifter for memory applications. Also, in other embodiments, various schemes and techniques described herein may provide for robust wordline driver architecture that may be used to implement a high-speed wordline level-shifter with programmable power cut-off in relevant memory applications. Further, in other embodiments, various schemes and techniques described herein may provide for robust wordline driver architecture that may be used to implement a low power extended range level-shifter for SRAM wordline drivers in other relevant memory applications.

Some proposed designs seek to introduce a high-speed wordline driver (WLD) with integrated level shifter (LS) that improves dual rail range and also reduces DC current leakage. This embodiment may enable low voltage designs for on-chip (e.g., CPU/SoC) related applications so as to save power. As described in greater detail herein, the various wordline driver designs may be used for level-shifting row clock signals from the periphery voltage domain (VDDPE) to the core voltage domain (VDDCE) by implementing a bypass level shifter with programmable bypass input. In this instance, when VDDPE=VDDCE, the programmable bypass level shifter may be used to disable level-shifting functionality so as to thereby and improve performance. Some advantages of this circuit may refer to improving level-shifting range and reducing DC current with little to no impact on wordline clock rise timing. Other advantages may refer to little to no impact on wordline clock fall timing, e.g., when VDDPE>=VDDCE, and in some cases, there may be little to no impact on wordline clock fall timing, e.g., when VDDPE<VDDCE. Moreover, the programmable bypass level shifter described herein may be used in various other applications, such as, e.g., dummy wordline (DWL) driver circuitry and write driver (YW) circuitry. For instance, the DWL level-shifter driver design with programmable bypass may be used in DWL and YW applications so as to improve the level-shifting ranges for VDDPE<VDDCE corners without penalizing timing at VDDPE=VDDCE corners.

Some proposed designs seek to introduce a high-speed wordline driver (WLD) with programmable power cut-off so as to improve dual rail range and also to reduce DC current leakage. This embodiment may enable various low voltage designs for some on-chip (e.g., CPU/SoC) related applications so as to save power. As described in greater detail herein, the various wordline driver designs may be used for controlling power-gated wordlines and core voltage supply with a row clock signal. In this instance, when the row clock is high, a control signal may be used for selective cut-off of the wordline driver, which may be cut-off during bypass operations. As such, during VDDPE>=VDDCE, bypass is placed in a logic 1 state, which may be used to clamp a row clock control signal, which is normally in an active operational state. Some advantages of this WLD circuitry may refer to improving level-shifting range along with reducing DC current with little to no impact on wordline clock rise timing. Other advantages may refer to little to no impact on wordline clock fall timing, e.g., when VDDPE>=VDDCE, and in some cases, there may be little to no impact on wordline clock fall timing, e.g., when VDDPE<VDDCE.

Further, some proposed designs seek to introduce a high-speed and low-power extended range level-shifter for wordline driver applications that may reduce (or eliminate) PMOS contention in level-shift corners through closed-loop feedback thereby reducing (or eliminating) PMOS contention in NAND based level shifter designs used in some wordline drivers. This embodiment may provide for extending the dual rail range supported when compared to conventional designs, which may reduce active mode static DC current. This WLD design may also enable on-chip (e.g., SOCs) scaling of periphery logic power supply to lower voltages so as to save power. As described in greater detail herein, the various wordline driver designs may be used for providing a feedback device to cut-off the closed-loop system during the wordline rising edge so as to extend the level shifted range. Also, an additional precharge device may be used to restore the power supply to PMOS devices so as to enable the wordline falling edge. Some advantages may refer to improving the level-shifting range in multi-Vt and single-Vt configurations. Other advantages may refer to improving wordline rising edge and/or delay due to reduction (or elimination) of PMOS contention, which results in a robust wordline pulse in level-shifting corners. In some instances, static DC current in active mode may be reduced during level-shifting operations. In other instances, static DC current in active mode may be completely eliminated during level-shifting operations. Also, when VDDCE=VDDPE, there may be no degradation in wordline rising or falling edge delay. Otherwise, when VDDCE>VDDPE, there may be no degradation in wordline rising edge degradation on the wordline falling edge due to delay through the level-shifter.

The memory architecture may refer to various volatile memory and non-volatile memory, such as, e.g., static random access memory (SRAM) and/or magneto-resistive random access memory (MRAM). The memory architecture may include memory circuitry having a core array of memory cells or bitcells that are accessible via data access lines, such as one or more wordlines and bitlines. In SRAM applications, data access lines refer to complementary bit-lines (BL, NBL), and in MRAM applications, data access lines refer to at least one bitline (BL) and at least one source line (SL).

Various implementations of wordline driver schemes and techniques for some memory applications will be described herein with reference to FIGS. 1-5.

FIG. 1 illustrates a diagram of wordline driver architecture 104 in accordance with various implementations described herein.

In some implementations, the wordline driver architecture 104 along with other related circuitry may be implemented as a system or a device with integrated circuit (IC) components that are arranged and coupled together as an assemblage or combination of parts that provide for physical circuit designs and related structures. In some instances, a method of designing, providing, building, fabricating and/or manufacturing the wordline driver architecture 104 as an integrated system or device may involve use of the various IC circuit components described herein so as to implement wordline driver schemes and techniques associated therewith. Moreover, the wordline driver architecture 104 may be integrated with computing circuitry and various other related components on a single chip, and also, the wordline driver architecture 104 may be implemented in embedded systems related to automotive, electronic, mobile, server and Internet-of-things (IoT) applications, including, e.g., remote sensor nodes and/or various other related components.

As shown in FIG. 1, the wordline driver architecture 104 may include various circuitry and components that are configured to operate in different voltage domains, such as, e.g., a periphery voltage domain (VDDPE) and a core voltage domain (VDDCE). For instance, the wordline driver architecture 104 may include a logic device (L1) that operates in the periphery voltage domain (VDDPE). Also, the wordline driver architecture 104 may include a level shifter 108 that operates in the periphery voltage domain (VDDPE) and the core voltage domain (VDDCE). Also, the wordline driver architecture 104 may include a wordline driver group 114 having multiple wordline driver circuits (e.g., RL0/D0, RL1/D1, RL2/D2, RL3/D3) that operate in the core voltage domain (VDDCE).

In some implementations, the logic device (L1) receives multiple input signals (e.g., g0, g1) and provides a row selection signal (rowsel) in the VDDPE domain. In some instances, the logic device (L1) may refer to a NOR gate configuration; however, in other instances, various other logic gates may be used to achieve similar behavior. Also, the input signals (e.g., g0, g1) may be used as a 2-bit row selection input.

In some implementations, the level shifter 108 may receive one or more input signals (e.g., inp_sig) and provide a row clock signal (e.g., rowclk<0>) to a first wordline driver circuit (e.g., RL0/D0). In various instances, the level shifter 108 may include various circuitry and components that are configured to operate in different voltage domains, such as, e.g., the VDDPE domain and the VDDCE domain. These features and various other aspects related to the level shifter 108 will be described in greater detail herein.

In some implementations, the wordline driver group 114 may include multiple wordline driver circuits (e.g., RL0/D0, RL1/D1, RL2/D2, RL3/D3) that operate in the core voltage domain (VDDCE). For instance, as shown in FIG. 1, the wordline driver group 114 may include four (4) wordline driver circuits (e.g., RL0/D0, RL1/D1, RL2/D2, RL3/D3) that operate in the VDDCE domain. The first wordline driver circuit (RL0/D0) may include logic devices (RL0, D0) that are arranged to receive input signals (rowclk<0>, rowsel) and provide a first wordline signal (WL<0>) as output to a first wordline (WL0). Similarly, the second wordline driver circuit (RL1/D1) may include logic devices (RL1, D1) arranged to receive input signals (rowclk<1>, rowsel) and provide a second wordline signal (WL<2>) as output to a second wordline (WL1). Similarly, the third wordline driver circuit (RL2/D2) may include logic devices (RL2, D2) arranged to receive input signals (rowclk<2>, rowsel) and provide a third wordline signal (WL<3>) as output to a third wordline (WL2). Further, similarly, the fourth wordline driver circuit (RL3/D3) may include logic devices (RL3, D3) arranged to receive input signals (rowclk<3>, rowsel) and provide a third wordline signal (WL<3>) as output to a third wordline (WL3).

In various other implementations, the wordline driver group 114 may refer to a scalable wordline driver group having any number (e.g., N) of wordline driver circuits that are coupled to any number of corresponding wordlines (WLs). These features and various other aspects related to scalable wordline driver groups and/or wordline driver circuits may be used with various wordline driver schemes and techniques described herein.

In various implementations, the wordline driver architecture 104 may be utilized in various memory applications, such as, e.g., random access memory (RAM), including static RAM (SRAM), magneto-resistive RAM (MRAM), and/or some other type of similar memory. Also, the wordline driver architecture 104 may be implemented as an integrated circuit (IC) with dual rail memory architecture and any related circuitry. The wordline driver architecture 104 may be integrated with computing circuitry and related components on a single chip, and also, the wordline driver architecture 104 may be implemented in various embedded systems for automotive, electronic, mobile, server and IoT applications.

Moreover, the wordline driver architecture 104 may be implemented in various core bitcell array circuitry that has an array of memory cells, wherein each memory cell may be referred to as a bitcell (BC). Also, each memory cell (or bitcell) may be configured to store at least one data bit value (e.g., a data value related to a logical '0' or '1'). Also, the memory array may include any number (N) of memory cells (or bitcells) arranged in any applicable configuration, such as, e.g., a two-dimensional (2D) memory array having any number (N) of columns (N_columns) and any number (N) of rows (N_rows) with the memory cells arranged in a 2D grid pattern with associated indexing capabilities.

Figure 2A:
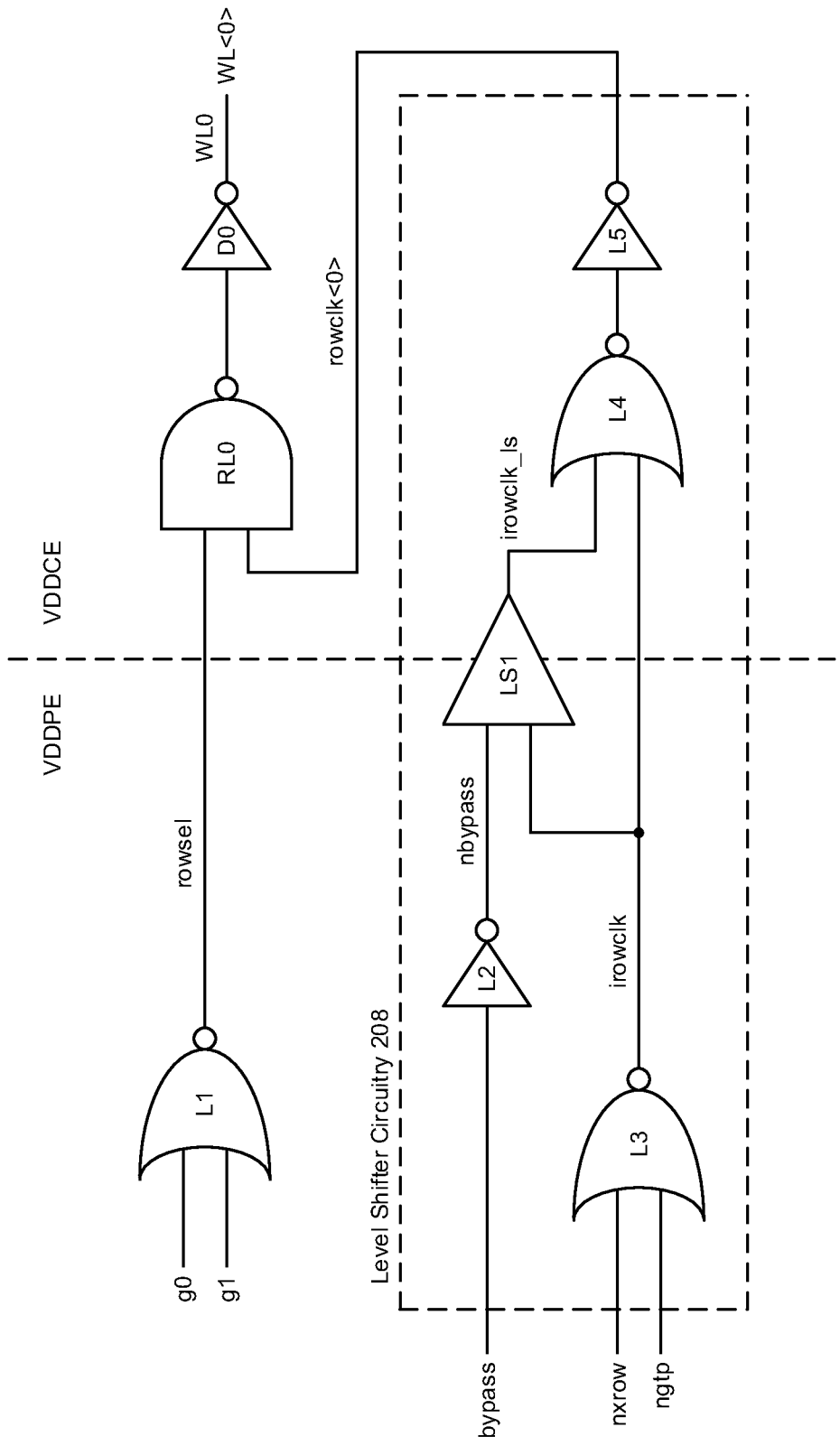
FIGS. 2A-2D illustrate various related diagrams of wordline driver architecture in accordance with various implementations described herein.
Figure 2B:
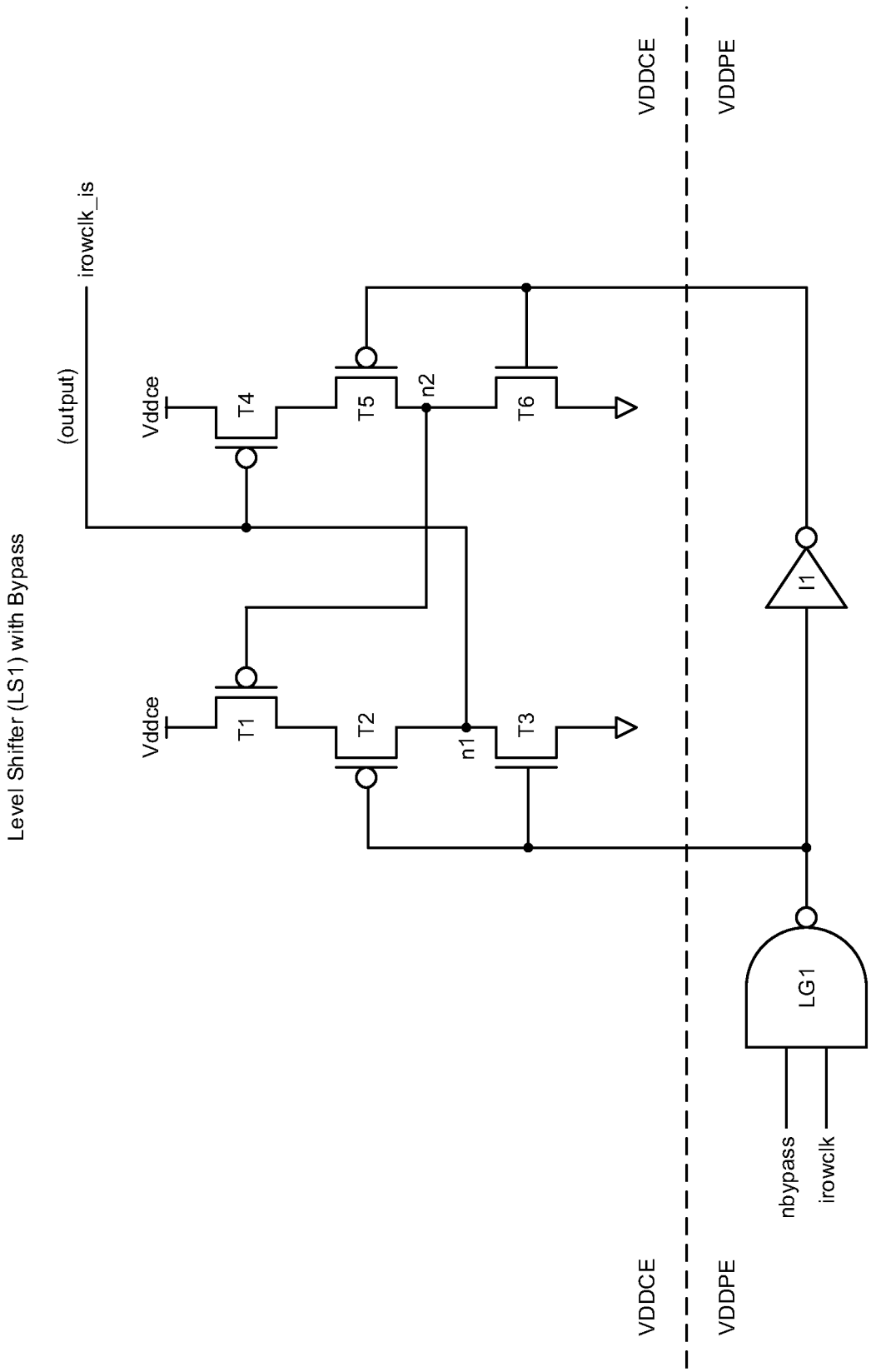
Figure 2C:
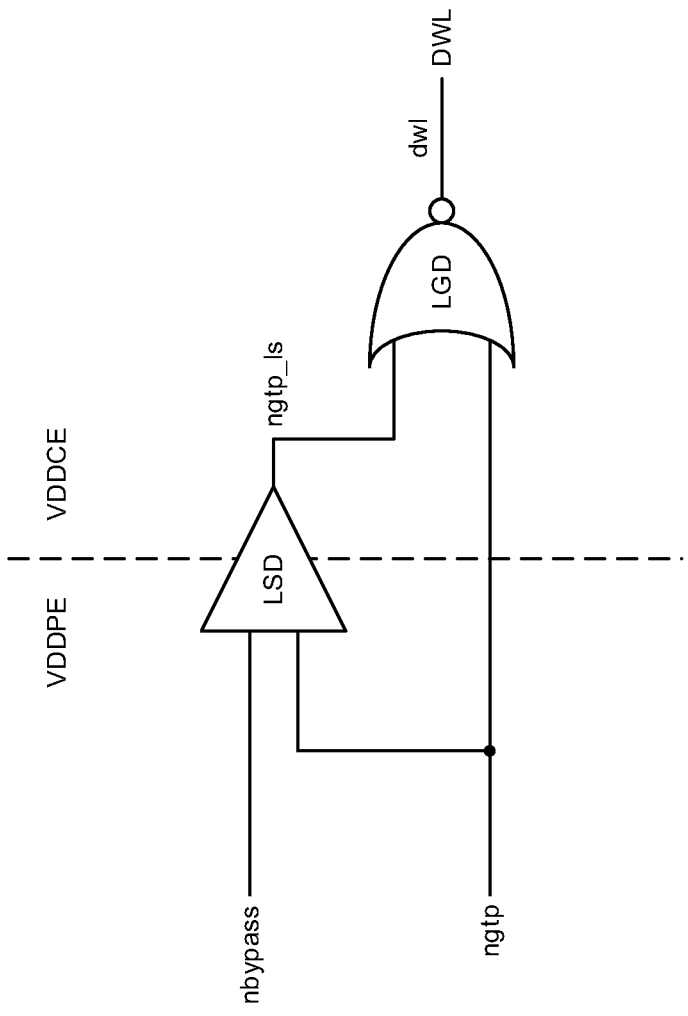
Figure 2D:
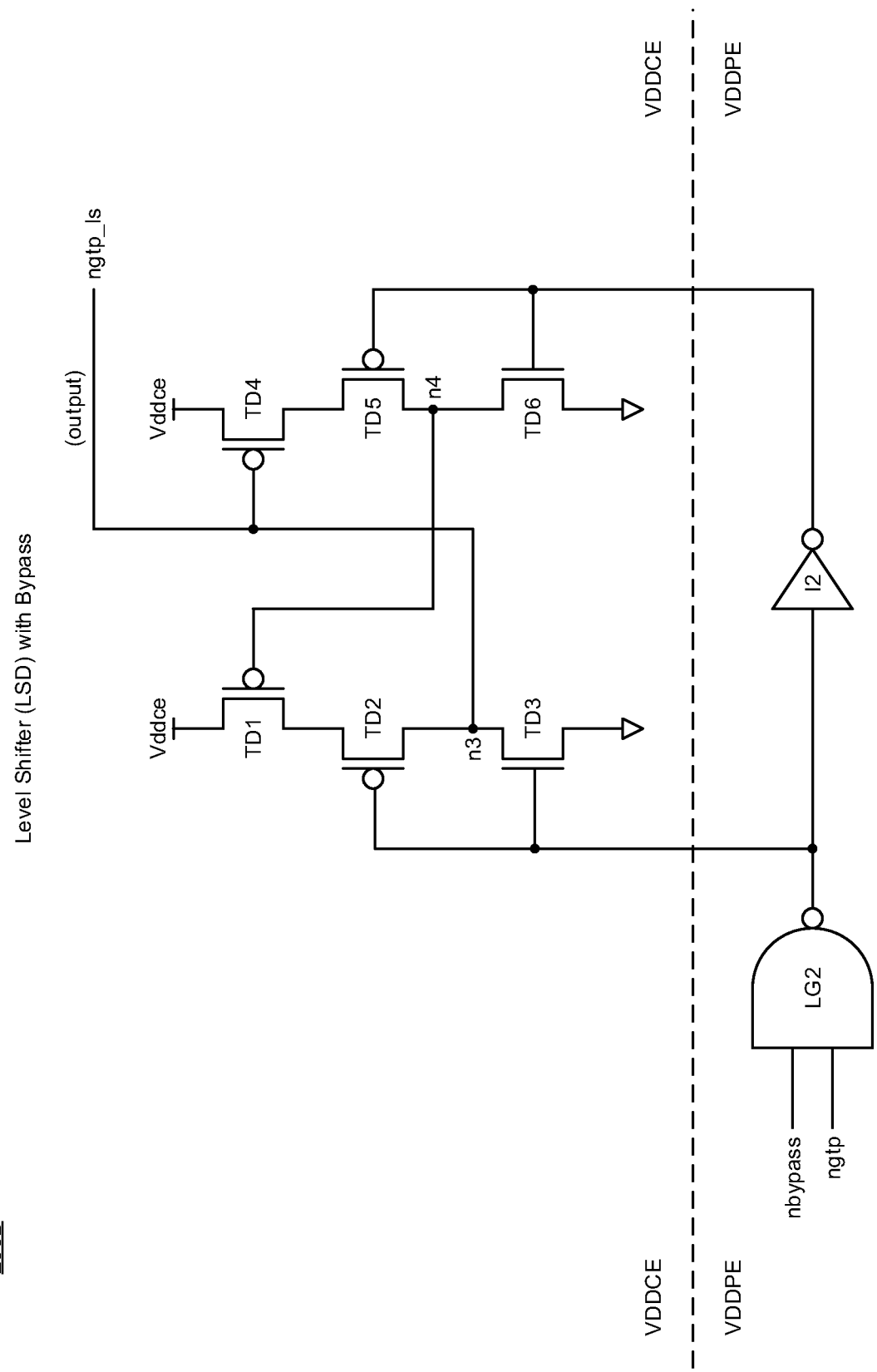

FIGS. 2A-2D illustrate various related diagrams of wordline driver architecture in accordance with various implementations described herein. In particular, FIG. 2A shows a diagram 200A of wordline driver architecture 204A, FIG. 2B shows a diagram 200B of level shifter (LS1) circuitry with bypass, FIG. 2C shows another diagram 200C of dummy wordline driver (DWL) circuitry 204C, and FIG. 2D shows another diagram 200D of other level shifter (LSD) circuitry with bypass.

In some implementations, the wordline driver architecture 204A may refer to a system or device having various integrated circuit (IC) components that are arranged and coupled together as an assemblage or combination of parts that provide for physical circuit layout designs and various related structures. In some instances, a method of designing, providing, building, fabricating and/or manufacturing the wordline driver architecture 204A as an integrated system or device may involve use of various IC circuitry and components described herein so as to implement wordline driver schemes and techniques associated therewith. Moreover, the wordline driver architecture 204A may also be integrated with computing circuitry and/or related components on a single chip, and the wordline driver architecture 204A may be implemented in embedded systems for automotive, electronic, mobile, server and IoT applications.

As shown in FIG. 2A, the wordline driver architecture 204A may have various circuitry and components that are configured to operate in different voltage domains, such as, e.g., the VDDPE domain and/or the VDDCE domain. For instance, the wordline driver architecture 204A may include the logic device (L1) that operates in the periphery voltage domain (VDDPE). Also, the wordline driver architecture 204A may include the level shifter circuitry 208 that operates in the VDDPE domain and the VDDCE domain. Moreover, the wordline driver architecture 204A may include a wordline driver group having one or more wordline driver circuits (e.g., RL0/D0, RL1/D1, RL2/D2, RL3/D3) that operate in the core voltage domain (VDDCE). In this instance, to simplify this description, the first wordline driver circuit (RL0/D0) is shown; however, this description may be similarly applied to any scalable wordline driver group with any number of wordline driver circuits so as to achieve similar behavior and results in a manner as described herein.

In some implementations, the logic device (L1) receives the input signals (e.g., g0, g1) and provides the row selection signal (rowsel) in the VDDPE domain. In some instances, the logic device (L1) may refer to a NOR gate configuration; however, in other instances, various other logic gates may be used to achieve similar behavior. Also, the input signals (e.g., g0, g1) may be used as a 2-bit row selection input.

In some implementations, the level shifter circuitry 208 may receive one or more input signals (e.g., bypass, nxrow, ngtp) and provide the row clock signal (e.g., rowclk<0>) to the first wordline driver circuit (RL0/D0). In various instances, the level shifter circuitry 208 may have various circuitry and components that are configured to operate in different voltage domains, such as, e.g., VDDPE domain and VDDCE domain. In some instances, the level shifter circuitry 208 may include various logic devices (e.g., L2, L3, L4, L5) along with a level shifter (LS1) that are arranged and configured to perform various level shifting operations as described herein. In some instances, the logic devices (L2, L3, L4, L5) may have logic device (L2) that operates as an inverter to receive the bypass input signal and provide an inverted bypass signal (nbypass) to the level shifter (LS1). The logic devices (L2, L3, L4, L5) may include logic device (L3) that operates as a NOR gate to receive the input signals (nxrow, ngtp) and then provide internal row clock signal (irowclk) to the level shifter (LS1) and to the logic device (L4). The level shifter (LS1) may receive the nbypass signal, receive the irowclk signal, and then provide a level-shifted internal row clock signal (irowclk_ls) to the logic device (L4). The logic devices (L2, L3, L4, L5) may include logic device (L4) that operates, e.g., as a NOR gate to receive the irowclk_ls signal, receive the irowclk signal, and then provide an inverted rowclk<0>signal to the logic device (L5). The logic devices (L2, L3, L4, L5) may include logic device (L5) that operates as an inverter to receive the inverted rowclk<0>signal and then provide the rowclk<0>signal. These features and various other aspects related to the level shifter (LS1) will be described in greater detail herein in reference to FIG. 2B.

In some implementations, the first wordline driver circuit (RL0/D0) may include logic devices (RL0, D0) that are arranged to receive input signals (rowclk<0>, rowsel) and provide a first wordline signal (WL<0>) as output to a first wordline (WL0). As described herein, in various implementations, the first wordline driver circuit (RL0/D0) may be part of a scalable wordline driver group having any number (e.g., N) of wordline driver circuits coupled to any number of corresponding wordlines (WLs). These features and/or various other aspects related to scalable wordline driver groups and wordline driver circuits may be used with various wordline driver schemes and techniques described herein.

In some operational implementations, in reference to FIG. 2A, the wordline driver architecture 204A may refer to a device with a wordline driver (e.g., RL0, D0) that provides a wordline signal (e.g., WL<0>) to a wordline (WL0) based on a row selection signal (e.g., rowsel) and a row clock signal (e.g., rowclk<0>). Also, the device may have row selector logic (e.g., L1) that provides the row selection signal (e.g., rowsel) to the wordline driver (e.g., RL0/D0) based on first input signals (e.g., g0, g1) in the periphery voltage domain (VDDPE). Moreover, the device may have level shifter circuitry 208 that provides the row clock signal (e.g., rowclk<0>) to the wordline driver (RL0/D0) in the core voltage domain (VDDCE) based on second input signals (e.g., one or more of bypass, nxrow, ngtp) in the periphery voltage domain (VDDPE).

In various instances, the wordline driver (RL0/D0) operates in the core voltage domain (VDDCE), and also, the row selector logic (L1) operates in the periphery voltage domain (VDDPE). The wordline driver (RL0/D0) may have first logic (RL0) and second logic (D0) that are coupled in series and operate in the VDDCE domain. The first logic (RL0) may provide a complementary wordline signal (NWL<0>) to the second logic (D0) based on the row selection signal (rowsel) and/or the row clock signal (rowclk<0>). Also, the second logic (D0) may receive the complementary wordline signal (NWL<0>) from the first logic (RL0) and provide the wordline signal (WL<0>) to the wordline (WL0) based on the complementary wordline signal (NWL<0>).

In various instances, the level shifter circuitry 208 includes a bypass level shifter (LS1) that is configured to operate as a level shifter based on the bypass signal (nbypass) in a first logic state. Also, the bypass level shifter (LS1) may also be configured to operate as a clamp based on the bypass signal (nbypass) in a second logic state that is different than the first logic state. In some scenarios, when a periphery voltage level in the VDDPE domain is substantially similar (e.g., equal) to a core voltage level in the VDDCE domain, then the bypass level shifter (LS1) may be configured to disable level-shifting functionality so as to improve performance. In other scenarios, when the periphery voltage level in the VDDPE domain is dissimilar (e.g., at least lower) than the core voltage level in the VDDCE domain, the bypass level shifter (LS1) is configured to enable level-shifting functionality.

Moreover, in various instances, the level shifter circuitry 208 may include input logic (e.g., L2, L3) that is configured to operate in the VDDPE domain, and in addition, the level shifter circuitry 208 may also include output logic (e.g., L4, L5) that is configured to operate in the VDDCE domain. Also, the input logic (e.g., L2, L3) may provide the bypass signal (e.g., nbypass) and the internal row clock signal (e.g., irowclk) to the bypass level shifter (LS1) based on the second input signals (e.g., bypass, nxrow, ngtp). The bypass level shifter (LS1) may provide the level-shifted row clock signal (irowclk_ls) to the output logic (e.g., L4) in the VDDCE domain based on the bypass signal (e.g., nbypass) and the internal row clock signal (e.g., irowclk) from the input logic (e.g., L2, L3) in the VDDPE domain. The output logic (e.g., L4, L5) may provide the row clock signal (e.g., rowclk<0>) to the wordline driver (e.g., RL0, D0) in the VDDCE domain based on the internal row clock signal (e.g., irowclk) from the input logic (e.g., L3) in the VDDPE domain and based on the level-shifted row clock signal (e.g., irowclk_ls) from the bypass level shifter (LS1) in the VDDCE domain.

FIG. 2B shows the level shifter (LS1) circuitry with bypass in association with the bypass level shifter (LS1) in FIG. 2A. As shown in FIG. 2B, the level shifter (LS1) circuitry with bypass may include various circuitry and/or components that are configured to operate in different voltage domains, such as, e.g., the VDDPE domain and the VDDCE domain. As such, the level shifter (LS1) circuitry with bypass in FIG. 2B may be referred to as the bypass level shifter (LS1) in FIG. 2A.

In some implementations, the bypass level shifter (LS1) may include input logic (e.g., LG1, I1) that are arranged to receive input signals (e.g., nbypass, irowclk) and then provide output signals to transistor stacks (e.g., T1/T2/T3 and T4/T5/T6). As shown, the first transistor stack (T1/T2/T3) may include transistor T1 that is coupled between a supply voltage VDDCE and transistor T2, and transistor T2 is coupled between transistor T1 and transistor T3, and also, transistor T3 is coupled between transistor T2 and ground. Also, an output from logic gate (LG1) may be coupled to gates of transistors T2, T3 and an input of logic gate (I1), and an output of logic gate (I1) may be coupled to gates of transistors T5, T6. Further, the level-shifted output signal (irowclk_ls) may be provided by an internal node (n1) that is disposed between transistors T2, T3, and the internal node (n1) may be coupled to a gate of transistor T4. Another internal node (n2) may be cross-coupled to a gate of transistor T1, and also, the internal node (n2) may be disposed between transistors (T5, T6). As shown, the internal nodes (n1, n2) may be cross-coupled to the gates of the transistors (T1, T4) with the output provided by the internal node (n1).

Also, in some instances, the logic gates (LG1, I1) may be configured to operate in the VDDPE domain, and further, the transistor stacks (T1/T2/T3 and T4/T5/T6) may be configured to operate in the VDDCE domain. In various instances, first logic gate (LG1) may refer to a NAND gate, and the second logic gate (I1) may refer to an inverter. Further, transistors (T1, T2, T4, T5) may refer to PMOS transistors, and transistors (T3, T6) may refer to NMOS transistors; however, various other transistor configurations may be used to achieve similar behavior, results and characteristics.

FIG. 2C shows the dummy wordline driver (DWL) circuitry 204C, e.g., as may be related to the bypass level shifter (LS1) in FIGS. 2A-2B. As shown in FIG. 2C, the dummy wordline driver (DWL) circuitry 204C may have dummy level shifter (LSD) circuitry with various circuitry and/or components that are configured to operate in different voltage domains, such as, e.g., the VDDPE domain and the VDDCE domain. Also, the dummy level shifter (LSD) circuitry may be used to driver a dummy wordline (DWL).

In some implementations, the dummy level shifter (LSD) circuitry is configured to operate in the VDDPE domain and the VDDCE domain, and also, the dummy wordline driver (DWL) circuitry 204C may include a logic gate (LGD). As shown in FIG. 2C, the dummy level shifter (LSD) may be configured to receive input signals (e.g., nbypass, ngtp) and then provide a level-shifted ngtp signal (e.g., ngtp_ls). Also, the logic gate (LGD) may be configured to receive the ngtp signal, receive the level-shifted ngtp signal (e.g., ngtp_ls), and then provide a dummy wordline signal (dwl) to the DWL.

FIG. 2D shows the level shifter (LSD) circuitry with bypass in association with the dummy level shifter (LSD) in FIG. 2C. As shown in FIG. 2D, the level shifter (LSD) circuitry with bypass may include various circuitry and/or components that are configured to operate in different voltage domains, such as, e.g., the VDDPE domain and the VDDCE domain. In some instances, the level shifter (LSD) circuitry with bypass in FIG. 2D may be referred to as a dummy level shifter (LSD) with bypass in FIG. 2C.

In some implementations, the dummy level shifter (LSD) may include input logic (e.g., LG2, I2) that are arranged to receive input signals (e.g., nbypass, ngtp) and provide output signals to transistor stacks (TD1/TD2/TD3 and TD4/TD5/TD6). As shown, the first transistor stack (TD1/TD2/TD3) may have transistor TD1 that is coupled between a supply voltage VDDCE and transistor TD2, and transistor TD2 is coupled between transistor TD1 and transistor TD3, and also, another transistor TD3 is coupled between transistor TD2 and ground. Also, an output from logic gate (LG2) may be coupled to gates of transistors TD2, TD3 and an input of logic gate (I2), and an output of logic gate (I2) may be coupled to gates of transistors TD5, TD6. Further, the level-shifted output signal (ngtp_ls) may be provided by an internal node (n3) that is disposed between transistors TD2, TD3, and the internal node (n3) may be coupled to a gate of transistor TD4. Another internal node (n4) may be cross-coupled to a gate of transistor TD1, and also, the internal node (n4) may be disposed between transistors (TD5, TD6). In some instances, as shown in FIG. 2D, the internal nodes (n3, n4) may be cross-coupled to gates of the transistors (TD1, TD4) with the output provided by the internal node (n3).

Also, in some instances, the logic gates (LG2, I2) may be configured to operate in the VDDPE domain, and the transistor stacks (TD1/TD2/TD3 and TD4/TD5/TD6) may be configured to operate in the VDDCE domain. Further, first logic gate (LG2) may refer to a NAND gate, and also, the second logic gate (I2) may refer to an inverter. Moreover, transistors (TD1, TD2, TD4, TD5) may refer to PMOS transistors, and transistors (TD3, TD6) may refer to NMOS transistors; however, various other transistor configurations may be used to achieve similar behavior, results and characteristics.

Figure 3A:
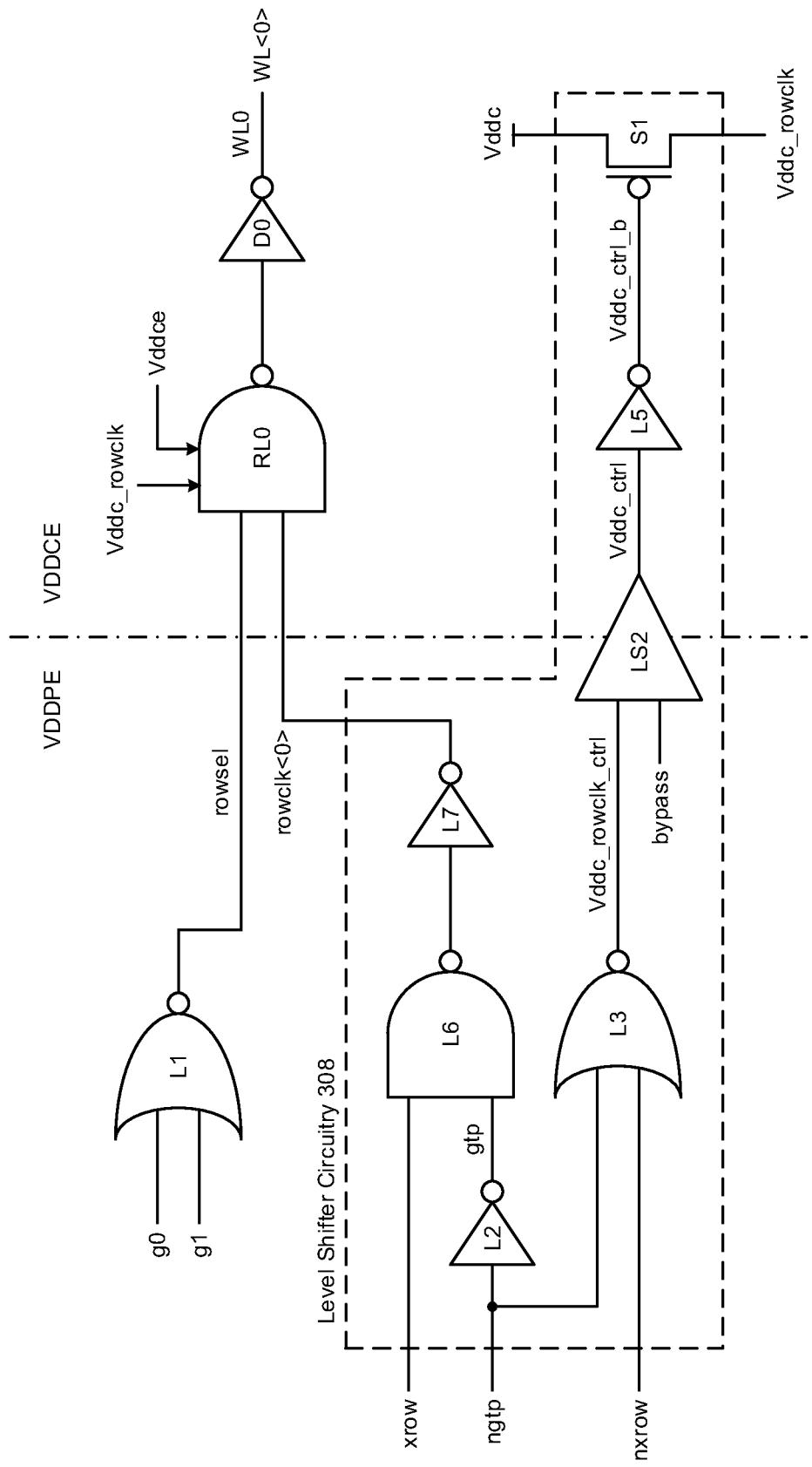
FIGS. 3A-3C illustrate various related diagrams of wordline driver architecture in accordance with various implementations described herein.
Figure 3B:
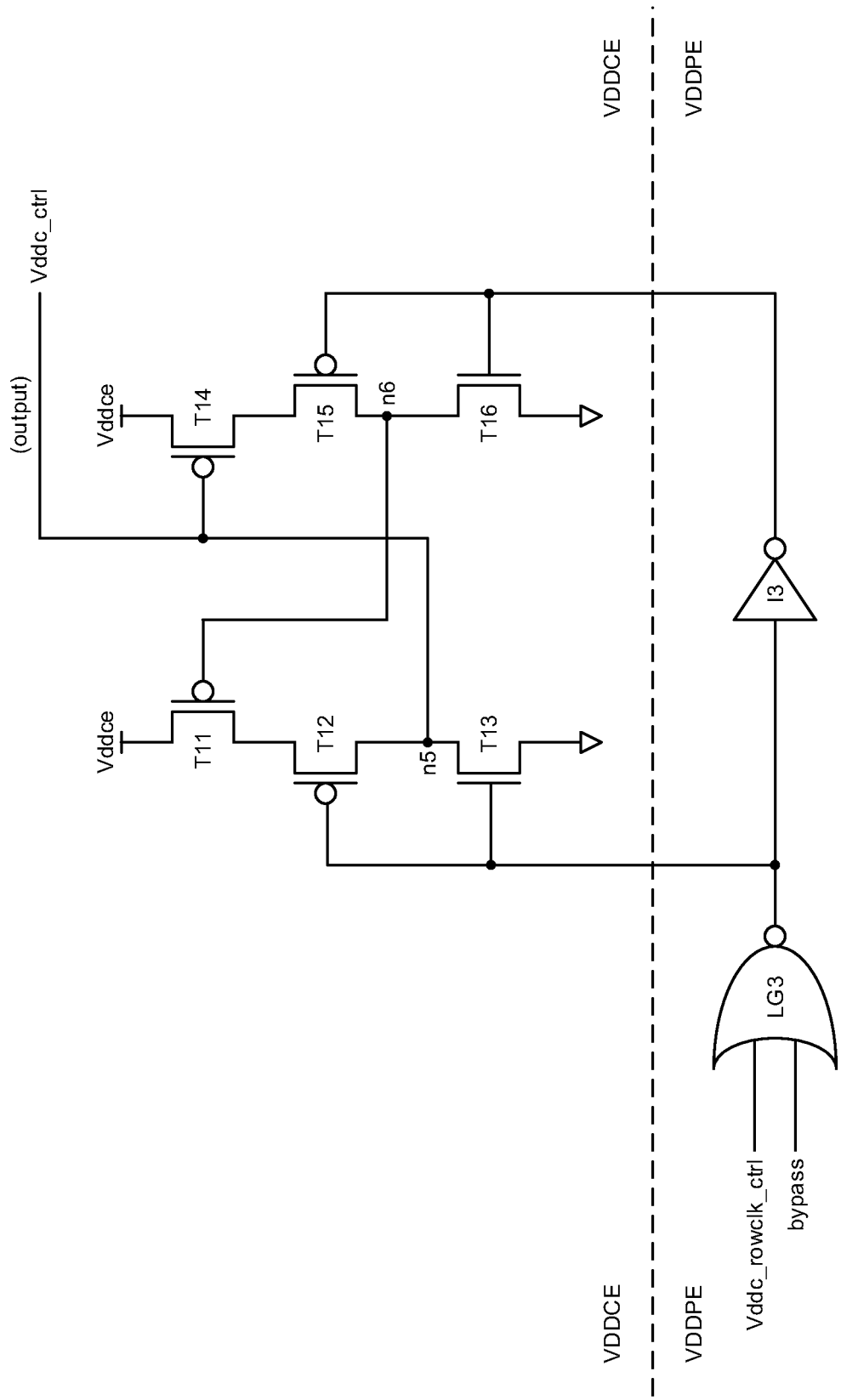
Figure 3C:
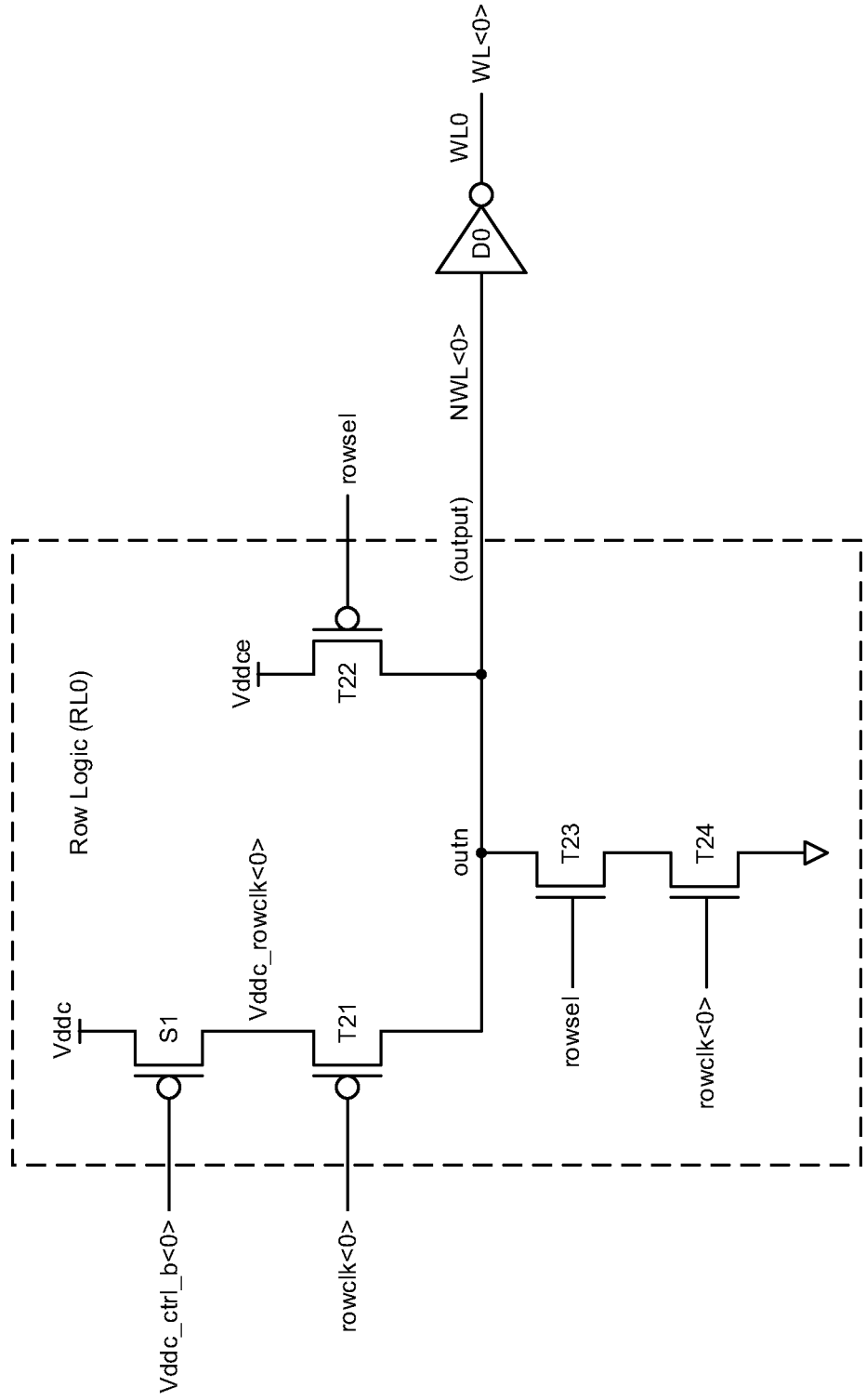

FIGS. 3A-3C illustrate various related diagrams of wordline driver architecture in accordance with various implementations described herein. In particular, FIG. 3A shows a diagram 300A of wordline driver architecture 304A, FIG. 3B shows a diagram 300B of level shifter (LS2) circuitry with bypass, and FIG. 3C shows a diagram 300C of wordline driver (WLD) circuitry 304C.

In some implementations, the wordline driver architecture 304A may refer to a system or device having various integrated circuit (IC) components that are arranged and coupled together as an assemblage or combination of parts that provide for physical circuit layout designs and various related structures. In some instances, a method of designing, providing, building, fabricating and/or manufacturing the wordline driver architecture 304A as an integrated system or device may involve use of various IC circuitry and components described herein so as to implement wordline driver schemes and techniques associated therewith. Moreover, the wordline driver architecture 304A may also be integrated with computing circuitry and/or related components on a single chip, and the wordline driver architecture 304A may be implemented in embedded systems for automotive, electronic, mobile, server and IoT applications.

As shown in FIG. 3A, the wordline driver architecture 304A may have various circuitry and components that are configured to operate in different voltage domains, such as, e.g., the VDDPE domain and/or the VDDCE domain. For instance, the wordline driver architecture 304A may include the logic device (L1) that operates in the periphery voltage domain (VDDPE). Also, the wordline driver architecture 304A may include the level shifter circuitry 308 that operates in the VDDPE domain and the VDDCE domain. Moreover, the wordline driver architecture 304A may include a wordline driver group having one or more wordline driver circuits (e.g., RL0/D0, RL1/D1, RL2/D2, RL3/D3) that operate in the core voltage domain (VDDCE). In this instance, to simplify this description, the first wordline driver circuit (RL0/D0) is shown; however, this description may be similarly applied to any scalable wordline driver group with any number of wordline driver circuits so as to achieve similar behavior and results in a manner as described herein.

In some implementations, the logic device (L1) receives the input signals (e.g., g0, g1) and provides the row selection signal (rowsel) in the VDDPE domain. In some instances, the logic device (L1) may refer to a NOR gate configuration; however, in other instances, various other logic gates may be used to achieve similar behavior. Also, the input signals (e.g., g0, g1) may be used as a 2-bit row selection input.

In some implementations, the level shifter circuitry 308 may receive one or more input signals (e.g., xrow, ngtp, nxrow) and provide the row clock signal (e.g., rowclk<0>) to the first wordline driver circuit (RL0/D0). In various instances, the level shifter circuitry 308 may have various circuitry and components that are configured to operate in different voltage domains, such as, e.g., VDDPE domain and VDDCE domain. In some instances, the level shifter circuitry 308 may include various logic devices (e.g., L2, L3, L5, L6, L7) along with a level shifter (LS2) that are arranged and configured to perform various level shifting operations as described herein. In some instances, the logic devices (L2, L3, L5, L6, L7) may have logic device (L2) that operates as an inverter to receive the input signal (ngtp) and then provide inverted ngtp signal (gtp) to logic device (L6). The logic devices (L2, L3, L5, L6, L7) may include logic device (L3) that operates as a NOR gate to receive the input signals (nxrow, ngtp) and provide internal row clock signal (Vddc_rowclk_ctrl) to the level shifter (LS2). Also, the level shifter (LS2) may receive the bypass signal, receive the Vddc_rowclk_ctrl signal, and provide a level-shifted row clock signal (Vddc_ctrl) to the logic device (L5). The logic devices (L2, L3, L5, L6, L7) may include the logic device (L5) that operates, e.g., as an inverter to receive the Vddc_ctrl signal and provide an inverted Vddc_ctrl signal (Vddc_ctrl_b) to a switch device (S1). The logic devices (L2, L3, L5, L6, L7) may include logic device (L7) that operates as an inverter to receive output from the logic device (L6) and then provide the rowclk<0>signal to the first wordline driver circuit (RL0/D0). These features and various other aspects related to the level shifter (LS2) will be described in greater detail herein in reference to FIG. 3B.

In some implementations, the switch device (S1) may refer to a transistor that is coupled between a supply voltage (Vddc) and the power connection of the logic device (RL0) of the first wordline driver circuit (RL0/D0). Also, the switch device (S1) may refer to a PMOS transistor that is activated by the Vddc_ctrl_b signal, which is provided by the logic device (L5). In other instances, various other switched transistors may be utilized to provide the switched power signal with similar behavior and results.

In some implementations, the first wordline driver circuit (RL0/D0) may include logic devices (RL0, D0) that are arranged to receive input signals (rowclk<0>, rowsel) and provide the first wordline signal (WL<0>) as output to the first wordline (WL0). The logic device (RL0) may include multiple power connections that are configured to receive the Vddc_rowclk signal from the switch device (S1) and also receive the Vddc_rowclk as the Vddce supply signal. As described herein, in various implementations, the first wordline driver circuit (RL0/D0) may be part of a scalable wordline driver group having any number (e.g., N) of wordline driver circuits coupled to any number of corresponding wordlines (WLs). These features and/or various other aspects related to scalable wordline driver groups and wordline driver circuits may be used with various wordline driver schemes and techniques described herein.

In some operational implementations, in reference to FIG. 3A, the wordline driver architecture 304A may refer to a device with a wordline driver (e.g., RL0, D0) that provides a wordline signal (e.g., WL<0>) to a wordline (WL0) based on a row selection signal (e.g., rowsel), a row clock signal (e.g., rowclk<0>) and also a switched power signal (e.g., Vddc_rowclk). Also, the device may have row selector logic (e.g., L1) that provides the row selection signal (e.g., rowsel) to the wordline driver (e.g., RL0/D0) based on first input signals (e.g., go, g1) in the VDDPE domain. Moreover, the device may include level shifter circuitry 308 that provides the row clock signal (e.g., rowclk<0>) to wordline driver (RL0/D0) in the VDDCE domain based on second input signals (e.g., xrow, ngtp, nxrow) in the VDDPE domain. In some instances, the level shifter circuitry 308 may also provide the switched power signal (e.g., Vddc_rowclk) to a power connection of the wordline driver (RL0/D0) based on the second input signals (e.g., xrow, ngtp, nxrow).

In various instances, the wordline driver (RL0/D0) operates in the core voltage domain (VDDCE), and also, the row selector logic (L1) operates in the periphery voltage domain (VDDPE). The wordline driver (RL0/D0) may have first logic (RL0) and second logic (D0) that are coupled in series and operate in the VDDCE domain. The first logic (RL0) may provide a complementary wordline signal (NWL<0>) to the second logic (D0) based on the row selection signal (rowsel), the row clock signal (rowclk<0>) and also the switched power signal (Vddc_rowclk). Moreover, the second logic (D0) may receive the complementary wordline signal (NWL<0>) from the first logic (RL0) and then provide the wordline signal (WL<0>) to the wordline (WL0) based on the complementary wordline signal (NWL<0>).

In various instances, the level shifter circuitry 308 includes a bypass level shifter (LS2) that is configured to operate as a level shifter based on the bypass signal (bypass) in a first logic state. Also, the bypass level shifter (LS2) may also be configured to operate as a clamp based on the bypass signal (bypass) in a second logic state that is different than the first logic state. The level shifter circuitry 308 may include a power-gated switch (S1) that is coupled between a core power supply (Vddc) and the power connection of the wordline driver (RL0/D0). The power-gated switch (S1) may be activated by the internal control signal (Vddc_ctrl/Vddc_ctrl_b) that is provided by the bypass level shifter (LS2) in the core voltage domain (VDDCE). Also, the level shifter circuitry 308 may include input logic (e.g., L2, L3, L6, L7) that operates in the VDDPE domain, and also, the level shifter circuitry 308 may include output logic (e.g., L5, S1) that operates in the VDDCE domain, and further, the input logic (e.g., L2, L3, L6, L7) may provide the row clock control signal (Vddc_rowclk) to the bypass level shifter (LS2) based on the second input signals (e.g., xrow, ngtp, nxrow)

In some scenarios, the bypass level shifter (LS2) provides a level-shifted control signal (Vddc_ctrl) to the output logic (L5, S1) in the core voltage domain (VDDCE) based on the row clock control signal (Vddc_rowclk_ctrl) from the input logic (L3) and the bypass signal (bypass) in the periphery voltage domain (VDDPE). In other scenarios, the output logic (L5) provides the internal control signal (Vddc_ctrl_b) to the gate of the power-gated switch (S1) in the core voltage domain (VDDCE) based on the row clock control signal (Vddc_rowclk_ctrl) from the input logic (L3) in the periphery voltage domain (VDDPE) and based on the level-shifted control signal (Vddc_ctrl) from the bypass level shifter (LS2) in the core voltage domain (VDDCE).

FIG. 3B shows the level shifter (LS2) circuitry with bypass in association with the bypass level shifter (LS2) in FIG. 3A. As shown in FIG. 3B, the level shifter (LS2) circuitry with bypass may include various circuitry and/or components that are configured to operate in different voltage domains, such as, e.g., the VDDPE domain and the VDDCE domain. As such, the level shifter (LS2) circuitry with bypass in FIG. 3B may be referred to as the bypass level shifter (LS2) in FIG. 3A.

In some implementations, the bypass level shifter (LS2) may include input logic (e.g., LG3, I3) that are arranged to receive input signals (e.g., bypass, Vddc_rowclk_ctrl) and provide output signals to transistor stacks (e.g., T11/T12/T13 and T14/T15/T16). As shown, the first transistor stack (T11/T12/T13) may include transistor T11 that is coupled between a supply voltage VDDCE and transistor T12, and also, transistor T12 is coupled between transistor T11 and transistor T13, and also, transistor T13 is coupled between transistor T12 and ground. Also, an output from logic gate (LG3) may be coupled to gates of transistors T12, T13 and an input of logic gate (I3), and an output of logic gate (I3) may be coupled to gates of transistors T15, T16. Further, level-shifted output signal (Vddc_ctrl) may be provided by an internal node (n5) that is disposed between transistors T12, T13, and the internal node (n5) may be coupled to a gate of transistor T14. Another internal node (n6) may be cross-coupled to a gate of transistor T11, and also, the internal node (n6) may be disposed between transistors (T15, T16). As shown, the internal nodes (n5, n6) may be cross-coupled to the gates of the transistors (T11, T14) along with the output provided by the internal node (n5).

Also, in some instances, the logic gates (LG3, I3) may be configured to operate in the VDDPE domain, and further, the transistor stacks (T11/T12/T13 and T14/T15/T16) may be configured to operate in the VDDCE domain. In various instances, first logic gate (LG3) may refer to a NOR gate, and the second logic gate (I3) may refer to an inverter. Moreover, transistors (T11, T12, T14, T15) may refer to PMOS transistors, and transistors (T13, T16) may refer to NMOS transistors; however, other transistor configurations may be used to achieve similar behavior, results and characteristics.

FIG. 3C shows the wordline driver (WLD) circuitry 304C as associated to the wordline driver (e.g., RL0, D0) in FIG. 3A. As shown in FIG. 3C, the wordline driver (WLD) circuitry 304C may include various circuitry and/or components that are configured to operate in the VDDCE domain. In some instances, the wordline driver (WLD) circuitry 304C may include the first row logic device (RL0) with transistors (e.g., S1, T21, T22, T23, T24) that are arranged and coupled together to provide the NWL<0>signal to the second row logic device (D0) based on input signals (e.g., rowsel, rowclk<0>, Vddc_ctrl_b<0>) that are provided to gates of transistors (e.g., S1, T21, T22, T23, T24).

In various implementations, transistors (S1, T21) are coupled in series between the supply voltage (Vddc) and output node (outn), and transistor (T22) is coupled between the supply voltage (Vddce) and output node (outn), and also, transistors (T23, T24) may be coupled between the output node (outn) and ground. The output node (outn) may also be coupled to an input of row logic device (D0) that operates as an inverter to receive the output signal (NWL<0>) as output from the first row logic (RL0) and provide the WL<0>signal to the wordline (WL0). The Vddc_ctrl_b signal is coupled to the gate of the power-gated switch transistor (S1) for activation thereof. The rowclk<0>signal is coupled to the gates of transistor (T21, T24) for activation thereof, and also, the rowsel signal is coupled to the gates of transistor (T22, T23) for activation thereof.

Figure 4A:
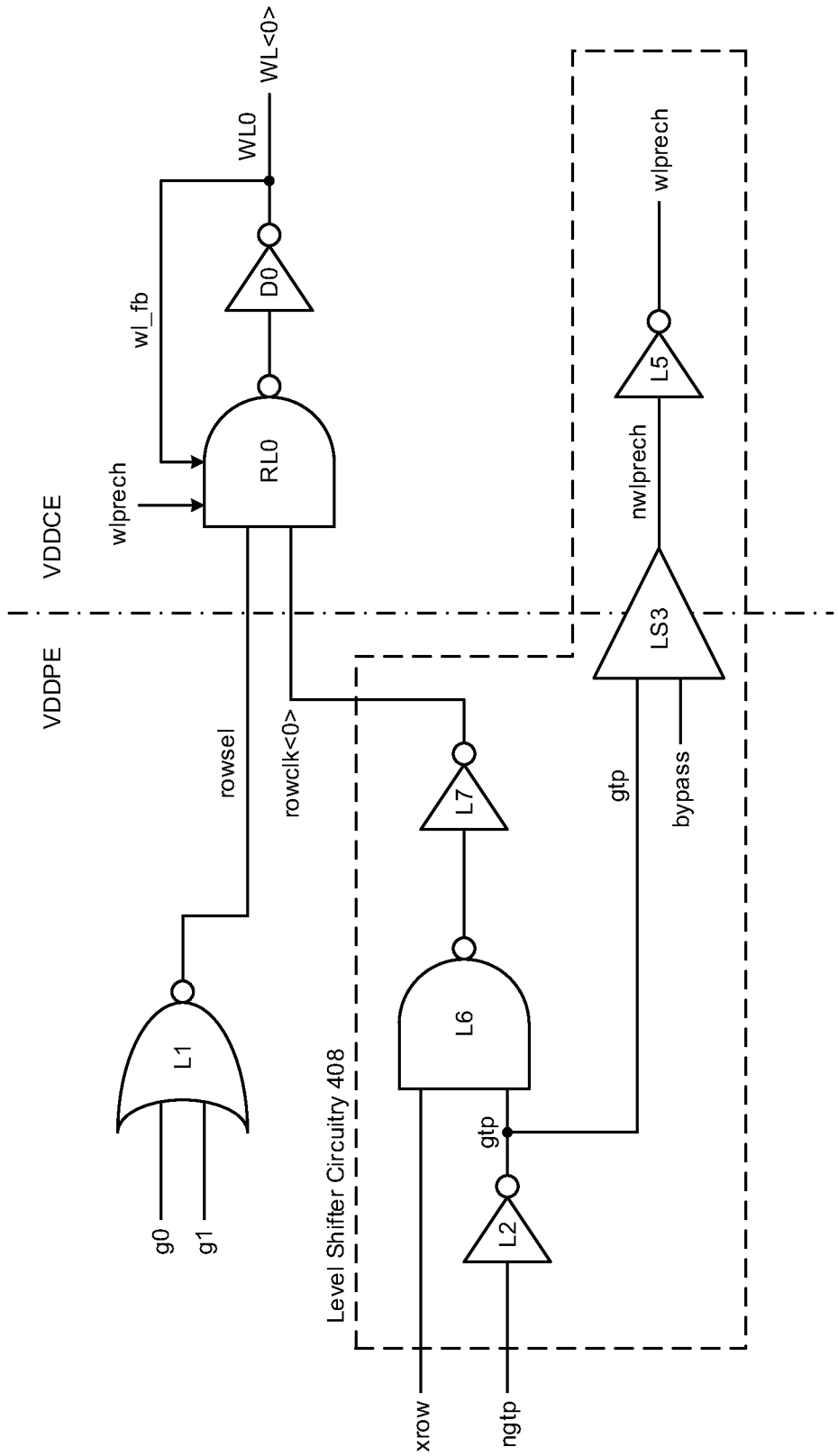
FIGS. 4A-4C illustrate various related diagrams of wordline driver architecture in accordance with various implementations described herein.
Figure 4B:
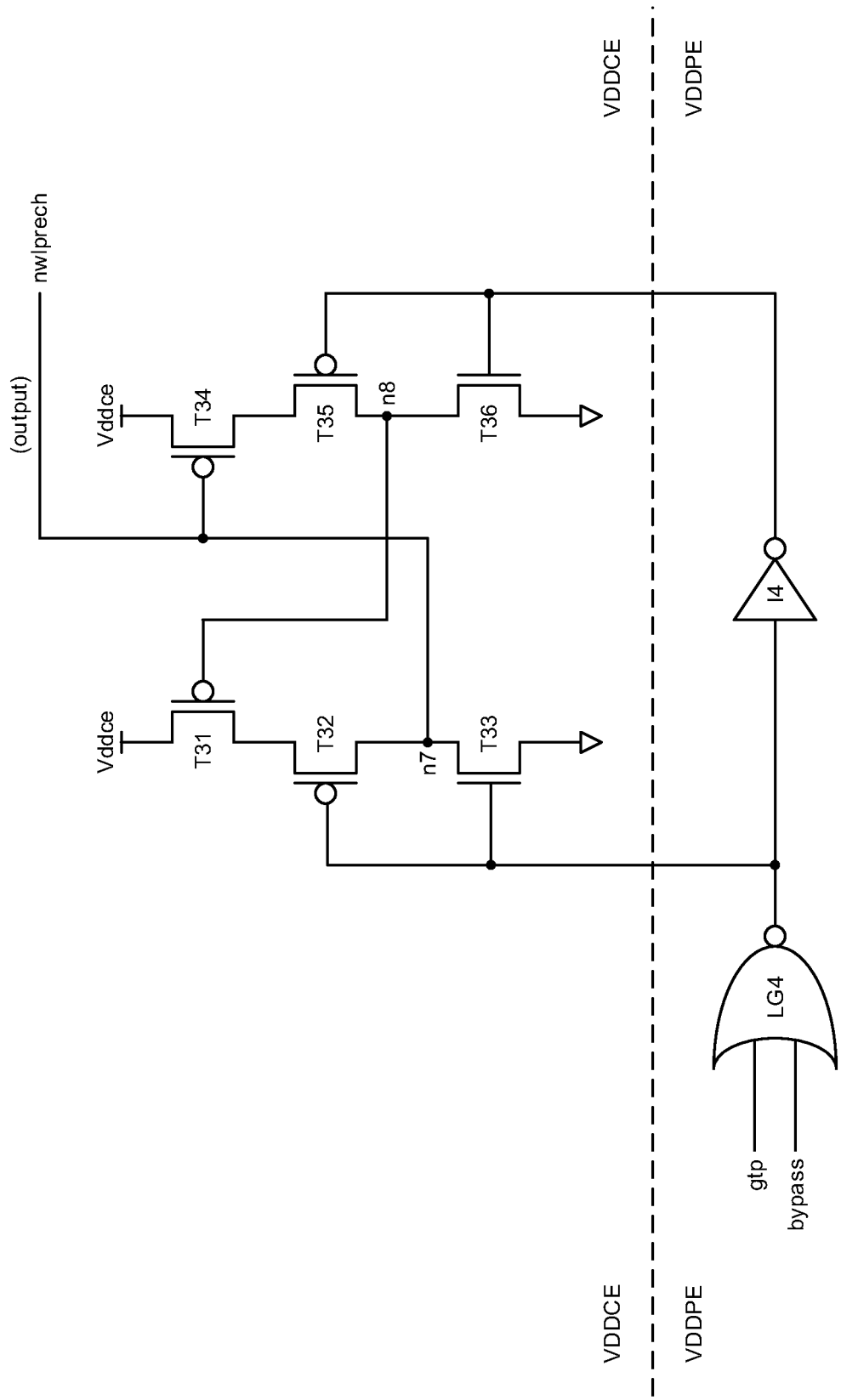
Figure 4C:
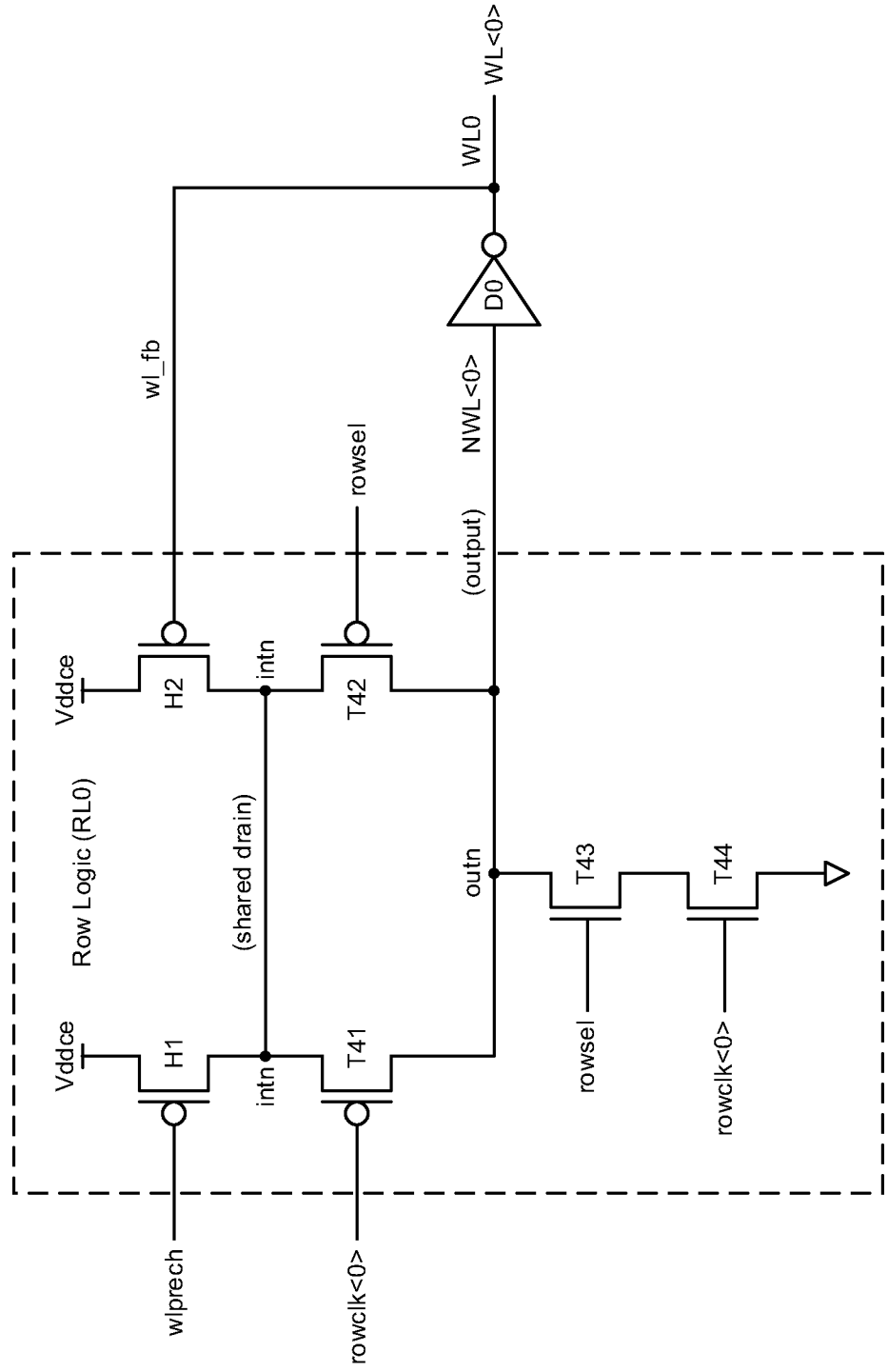

FIGS. 4A-4C illustrate various related diagrams of wordline driver architecture in accordance with various implementations described herein. In particular, FIG. 4A shows a diagram 400A of wordline driver architecture 404A, FIG. 4B shows a diagram 400B of level shifter (LS3) circuitry with bypass, and FIG. 4C shows a diagram 400C of wordline driver (WLD) circuitry 404C.

In some implementations, the wordline driver architecture 404A may refer to a system or device having various integrated circuit (IC) components that are arranged and coupled together as an assemblage or combination of parts that provide for physical circuit layout designs and various related structures. In some instances, a method of designing, providing, building, fabricating and/or manufacturing the wordline driver architecture 404A as an integrated system or device may involve use of various IC circuitry and components described herein so as to implement wordline driver schemes and techniques associated therewith. Moreover, the wordline driver architecture 404A may also be integrated with computing circuitry and/or related components on a single chip, and the wordline driver architecture 404A may be implemented in embedded systems for automotive, electronic, mobile, server and IoT applications.

As shown in FIG. 4A, the wordline driver architecture 404A may have various circuitry and components that are configured to operate in different voltage domains, such as, e.g., the VDDPE domain and/or the VDDCE domain. For instance, the wordline driver architecture 404A may include the logic device (L1) that operates in the periphery voltage domain (VDDPE). Also, the wordline driver architecture 404A may include the level shifter circuitry 408 that operates in the VDDPE domain and the VDDCE domain. Moreover, the wordline driver architecture 404A may include a wordline driver group having one or more wordline driver circuits (e.g., RL0/D0, RL1/D1, RL2/D2, RL3/D3) that operate in the core voltage domain (VDDCE). In this instance, to simplify this description, the first wordline driver circuit (RL0/D0) is shown; however, this description may be similarly applied to any scalable wordline driver group with any number of wordline driver circuits so as to achieve similar behavior and results in a manner as described herein.

In some implementations, the logic device (L1) receives the input signals (e.g., g0, g1) and provides the row selection signal (rowsel) in the VDDPE domain. In some instances, the logic device (L1) may refer to a NOR gate configuration; however, in other instances, various other logic gates may be used to achieve similar behavior. Also, the input signals (e.g., g0, g1) may be used as a 2-bit row selection input.

In some implementations, the level shifter circuitry 408 may receive one or more input signals (e.g., xrow, ngtp) and then provide the row clock signal (e.g., rowclk<0>) to the first wordline driver circuit (RL0/D0). In some instances, the level shifter circuitry 408 may include various circuitry and/or components that are configured to operate in different voltage domains, such as, e.g., VDDPE domain and VDDCE domain. In some instances, the level shifter circuitry 408 may include various logic devices (e.g., L2, L5, L6, L7) along with a level shifter (LS3) that are arranged and configured to perform various level shifting operations as described herein. In some instances, the logic devices (L2, L5, L6, L7) may have logic device (L2) that operates as an inverter to receive the input signal (ngtp) and then provide inverted ngtp signal (gtp) to the logic device (L6). Also, the level shifter (LS3) may receive the bypass signal, receive the gtp signal, and provide a level-shifted wordline precharge signal (nwlprech) to the logic device (L5). Also, the logic devices (L2, L5, L6, L7) may include the logic device (L5) that operates, e.g., as an inverter to receive the nwlprech signal and provide an inverted nwlprech signal (wlprech) to a power connection of the logic device (RL0). The logic devices (L2, L5, L6, L7) may include logic device (L7) that operates as an inverter to receive output from the logic device (L6) and then provide the rowclk<0>signal to the wordline driver circuit (RL0/D0). These features and various other aspects related to the level shifter (LS3) will be described in greater detail herein in reference to FIG. 4B.

In some implementations, the first wordline driver circuit (RL0/D0) may include logic devices (RL0, D0) that are arranged to receive input signals (rowclk<0>, rowsel) and provide the first wordline signal (WL<0>) as output to the first wordline (WL0). The logic device (RL0) may include multiple power connections that are configured to receive the wlprech signal from the logic device (L5) and receive a wordline feedback signal (wl_fb) from an output of the logic device (D0). As described herein, in various implementations, the first wordline driver circuit (RL0/D0) may be part of a scalable wordline driver group having any number (e.g., N) of wordline driver circuits that are coupled to any number of corresponding wordlines (WLs). These features and/or various other aspects related to scalable wordline driver groups and wordline driver circuits may be used with various wordline driver schemes and techniques described herein.

In some operational implementations, in reference to FIG. 4A, the wordline driver architecture 404A may refer to a device with a wordline driver (e.g., RL0, D0) that provides the wordline signal (e.g., WL<0>) to the wordline (e.g., WL0) based on the row selection signal (e.g., rowsel), the row clock signal (e.g., rowclk<0>), a wordline precharge signal (e.g., wlprech) and a wordline feedback signal (wl_fb). Also, the device may have row selector logic (e.g., L1) that provides the row selection signal (e.g., rowsel) to the wordline driver (e.g., RL0/D0) based on first input signals (e.g., g0, g1) in the VDDPE domain. Moreover, the device may include level shifter circuitry 408 that provides the row clock signal (e.g., rowclk<0>) to wordline driver (RL0/D0) in the VDDCE domain based on second input signals (e.g., xrow, ngtp) in the VDDPE domain. The level shifter circuitry 408 may also provide the level shifter circuitry (LS3) may provide the wordline precharge signal (e.g., wlprech) to a first power connection of the wordline driver (RL0/D0) based on the second input signals (e.g., xrow, ngtp). Also, in some instances, the wordline signal (WL<0>) may be fed back to a second power connection of the wordline driver (RL0/D0) as the wordline feedback signal (wl_fb).

In various instances, the wordline driver (RL0/D0) operates in the core voltage domain (VDDCE), and also, the row selector logic (L1) operates in the periphery voltage domain (VDDPE). The wordline driver (RL0/D0) may have first logic (RL0) and second logic (D0) that are coupled in series and operate in the VDDCE domain. The first logic (RL0) may provide a complementary wordline signal (NWL<0>) to the second logic (D0) based on the row selection signal (rowsel), the row clock signal (rowclk<0>), the wordline precharge signal (wlprech) and the wordline feedback signal (wl_fb). Further, the second logic (D0) may receive the complementary wordline signal (NWL<0>) from the first logic (RL0) and then provides the wordline signal (WL<0>) to the wordline (WL0) based on the complementary wordline signal (NWL<0>). The second logic (D0) provides the wordline feedback signal (wl_fb) to the power connection of the logic device (RL0).

In various instances, the wordline driver (RL0/D0) may include multiple power connections, including, e.g., a first power connection and a second power connection. As shown in FIG. 4A, the first power connection of the wordline driver (RL0/D0) may refer to the first power connection of the first logic (RL0), and the second power connection of the wordline driver (RL0/D0) may refer to the second power connection of the first logic (RL0). Also, as shown in FIG. 4A, the wlprech signal may be provided to the first power connection of the first logic (RL0), and further, the wl_fb signal may be provided to the second power connection of the first logic (RL0).

In various instances, the level shifter circuitry 408 includes a bypass level shifter (LS3) that is configured to operate as a level shifter based on the bypass signal (bypass) in a first logic state. Also, the bypass level shifter (LS3) may also be configured to operate as a clamp based on the bypass signal (bypass) in a second logic state that is different than the first logic state. The level shifter circuitry 408 may have input logic (e.g., L2, L6, L7) that operates in the VDDPE domain, and also, the level shifter circuitry 408 may have output logic (e.g., L5) that operates in the VDDCE domain, and also, the input logic (e.g., L2, L6, L7) may provide the gtp signal to the bypass level shifter (LS3) as another input based on the second input signals (e.g., xrow, ngtp).

In some scenarios, the input logic (L2) may provide a global timing pulse (gtp) signal to the bypass level shifter (LS3) based on the second input signals (ngtp). Also, the bypass level shifter (LS3) provides a level-shifted precharge signal (nwlprech) to the output logic (L5) in the VDDCE domain based on the global timing pulse (gtp) signal from the input logic (L2) and the bypass signal (bypass) in the VDDPE domain. Also, the output logic (L5) provides the wordline precharge signal (wlprech) to the first power connection of the logic device (RL0) of the wordline driver (RL0/D0) in the VDDCE domain based on the level-shifted precharge signal (nwlprech) in the VDDCE domain.

FIG. 4B shows the level shifter (LS3) circuitry with bypass in association with the bypass level shifter (LS3) in FIG. 4A. As shown in FIG. 4B, the level shifter (LS3) circuitry with bypass may include various circuitry and/or components that are configured to operate in different voltage domains, such as, e.g., the VDDPE domain and the VDDCE domain. As such, the level shifter (LS3) circuitry with bypass in FIG. 4B may be referred to as the bypass level shifter (LS3) in FIG. 4A.

In some implementations, the bypass level shifter (LS3) may include input logic (e.g., LG4, I4) that are arranged to receive input signals (e.g., bypass, gtp) and provide output signals to transistor stacks (e.g., T31/T32/T33 and T34/T35/T36). As shown, the first transistor stack (T31/T32/T33) may include transistor T31 that is coupled between a supply voltage VDDCE and transistor T32, and also, transistor T32 is coupled between transistor T31 and transistor T33, and also, transistor T33 is coupled between transistor T32 and ground. Also, an output from logic gate (LG4) may be coupled to the gates of transistors T32, T33 and an input of logic gate (I4), and an output of logic gate (I4) may be coupled to gates of transistors T35, T36. Further, level-shifted output signal (nwlprech) may be provided by an internal node (n7) that is disposed between transistors T32, T33, and the internal node (n7) may be coupled to the gate of transistor T34. Another internal node (n8) may be cross-coupled to the gate of transistor T31, and also, the internal node (n8) may be disposed between transistors (T35, T36). As shown, the internal nodes (n7, n8) may be cross-coupled to the gates of the transistors (T31, T34) along with the output provided by the internal node (n7).

Also, in some instances, the logic gates (LG4, I4) may be configured to operate in the VDDPE domain, and further, the transistor stacks (T31/T32/T33 and T34/T35/T36) may be configured to operate in the VDDCE domain. In various instances, first logic gate (LG4) may refer to a NOR gate, and the second logic gate (I4) may refer to an inverter. Moreover, transistors (T31, T32, T34, T35) may refer to PMOS transistors, and transistors (T33, T36) may refer to NMOS transistors; however, other transistor configurations may be used to achieve similar behavior, results and characteristics.

FIG. 4C shows the wordline driver (WLD) circuitry 404C as associated to the wordline driver (e.g., RL0, D0) in FIG. 4A. As shown in FIG. 4C, the wordline driver (WLD) circuitry 404C may include various circuitry and/or components that are configured to operate in the VDDCE domain. In some instances, the wordline driver (WLD) circuitry 404C may include the first row logic device (RL0) with transistors (e.g., H1, H2, T41, T42, T43, T44) that are arranged and coupled together to provide the NWL<0>signal to the second row logic device (D0) based on input signals (e.g., rowsel, rowclk<0>, wlprech) that are provided to gates of transistors (e.g., H1, H2, T41, T42, T43, T44).

In various implementations, transistors (H1, T41) are coupled in series between the supply voltage (Vddce) and output node (outn), and transistors (H2, T42) are coupled in series between the supply voltage (Vddce) and output node (outn), and also, transistors (T43, T44) may be coupled between the output node (outn) and ground. The output node (outn) may also be coupled to an input of row logic device (D0) that operates as an inverter to receive the output signal (NWL<0>) as output from the first row logic (RL0) and provide the WL<0>signal to the wordline (WL0). The wlprech signal is coupled to the gate of the first header transistor (H1) for activation thereof. The wl_fb signal is coupled to the gate of the second header transistor (H2) for activation thereof. Further, the rowclk<0>signal is coupled to the gates of transistor (T41, T44) for activation thereof, and also, the rowsel signal is coupled to the gates of transistor (T42, T43) for activation thereof.

In some implementations, as shown in FIG. 4C, the wordline precharge signal (wlprech) may be provide to the gate of the first header transistor (H1). Also, the wordline signal (WL<0>) may be provided to the gate of the second header transistor (H2) as the wordline feedback signal (wl_fb). Also, the drains of the header transistors (H1, H2) may be coupled together by way of an internal node (intn) so as to provide a shared drain.

Figure 5:
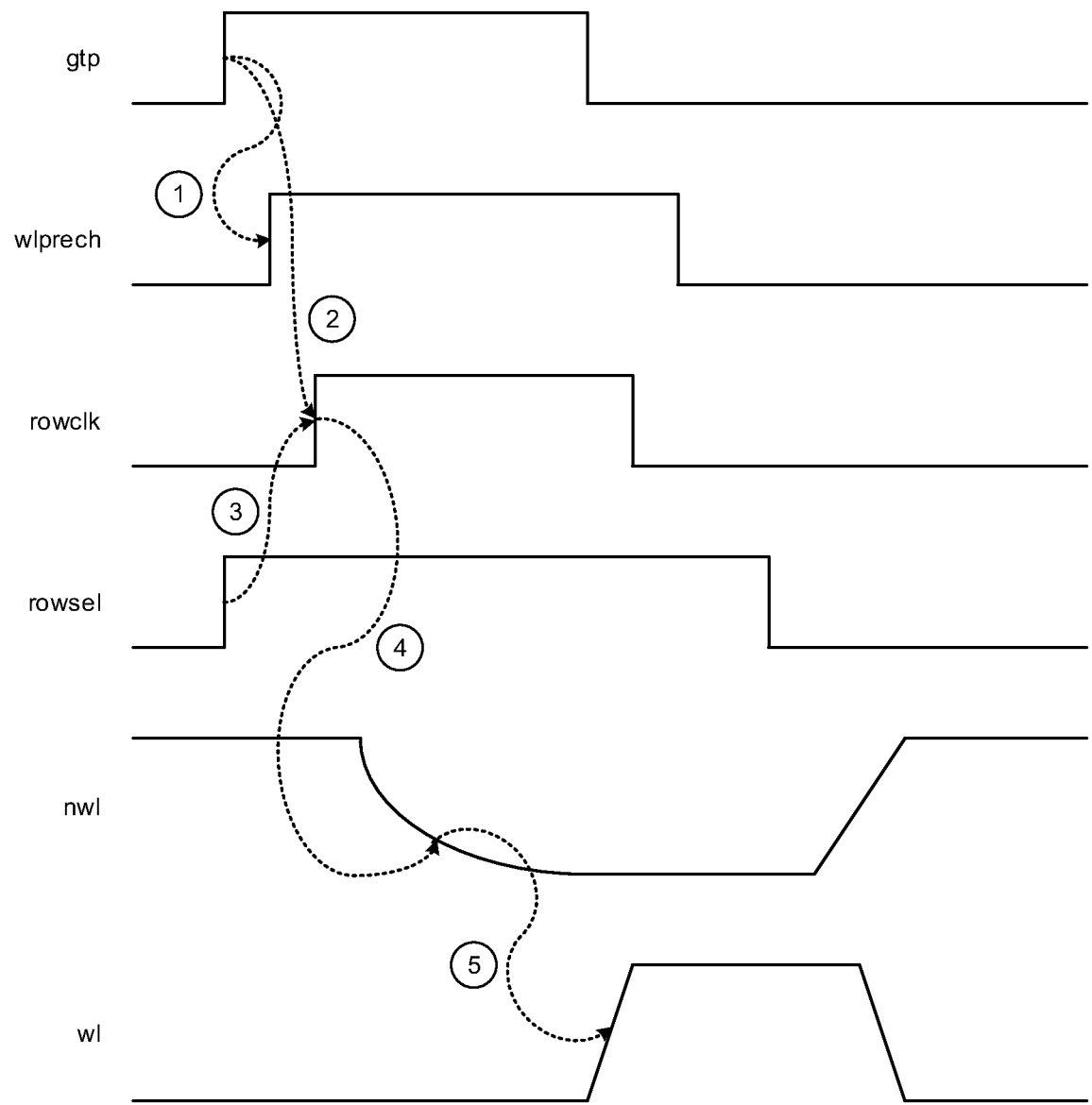
FIG. 5 illustrates a waveform diagram related to wordline precharge timing in accordance with various implementations described herein.

FIG. 5 illustrates a diagram 500 of wordline precharge timing waveforms 504 in accordance with various implementations described herein. In some implementations, the wordline precharge timing waveforms 504 are related to the input, output and internal signals for the wordline driver architecture 404A in FIGS. 4A-4C.

As shown in FIG. 5, a rising edge of the gtp pulse signal may trigger the rising edge of the wlprech pulse signal. Also, the rising edge of the rowsel pulse signal may also trigger (and/or at least assist with triggering) the rising edge of the rowclk pulse signal. Also, the rising edge of the rowclk pulse signal may trigger the falling edge of the nwl signal, which then triggers the rising sloped edge of the wl signal. In some instances, the falling edge of the nwl signal may be curved because it goes down slowly until the fight from the PMOS is removed.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device having a wordline driver that provides a wordline signal to a wordline based on a row selection signal and a row clock signal. The device may have row selector logic that provides the row selection signal to the wordline driver based on first input signals in a periphery voltage domain. The device may have level shifter circuitry that provides the row clock signal to the wordline driver in a core voltage domain based on second input signals in the periphery voltage domain.

Described herein are implementations of a device having a wordline driver that provides a wordline signal to a wordline based on a row selection signal, a row clock signal and a switched power signal. The device may have row selector logic that provides the row selection signal to the wordline driver based on first input signals in a periphery voltage domain. The device may have level shifter circuitry that provides the row clock signal to the wordline driver in a core voltage domain based on second input signals in the periphery voltage domain. The level shifter circuitry may provide the switched power signal to a power connection of the wordline driver based on the second input signals.

Described herein are implementations of a device having a wordline driver that provides a wordline signal to a wordline based on a row selection signal, a row clock signal, a wordline precharge signal and a wordline feedback signal. The device may have row selector logic that provides the row selection signal to the wordline driver based on first input signals in a periphery voltage domain. Also, the device may have level shifter circuitry that provides the row clock signal to the wordline driver in a core voltage domain based on second input signals in the periphery voltage domain. The level shifter circuitry may provide the wordline precharge signal to a first power connection of the wordline driver based on the second input signals, and the wordline signal may be fed back to a second power connection of the wordline driver as the wordline feedback signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   wordline driver that provides a wordline signal to a wordline based on a row selection signal and a row clock signal;
   row selector logic that provides the row selection signal to the wordline driver based on first input signals in a periphery voltage domain; and
   level shifter circuitry that provides the row clock signal to the wordline driver in a core voltage domain based on second input signals in the periphery voltage domain, wherein:
   the wordline driver includes first logic and second logic that are coupled in series and operate in the core voltage domain,
   the first logic provides a complementary wordline signal to the second logic based on the row selection signal and the row clock signal, and
   the second logic receives the complementary wordline signal from the first logic and provides the wordline signal to the wordline based on the complementary wordline signal.

2. The device of claim 1, wherein:
   the wordline driver operates in the core voltage domain, and
   the row selector logic operates in the periphery voltage domain.

3. The device of claim 2, wherein:
   the level shifter circuitry has a bypass level shifter that is configured to operate as a level shifter based on a bypass signal in a first logic state, and
   the bypass level shifter is also configured to operate as a clamp based on the bypass signal in a second logic state that is different than the first logic state.

4. The device of claim 3, wherein:
   when a periphery voltage level in the periphery voltage domain is substantially similar to a core voltage level in the core voltage domain, then the bypass level shifter is configured to disable level-shifting functionality so as to improve performance.

5. The device of claim 3, wherein:
   when a periphery voltage level in the periphery voltage domain is lower than the core voltage level in the core voltage domain, the bypass level shifter is configured to enable level-shifting functionality so as to improve performance and reduce leakage.

6. The device of claim 3, wherein the level shifter circuitry has input logic that operates in the periphery voltage domain, and wherein the level shifter circuitry has output logic that operates in the core voltage domain.

7. The device of claim 6, wherein:
the input logic provides a bypass signal and an internal row clock signal to the bypass level shifter based on the second input signals,
the bypass level shifter provides a level-shifted row clock signal to the output logic in the core voltage domain based on the bypass signal and the internal row clock signal from the input logic in the periphery voltage domain, and
the output logic provides the row clock signal to the wordline driver in the core voltage domain based on the internal row clock signal from the input logic in the periphery voltage domain and based on the level-shifted row clock signal from the bypass level shifter in the core voltage domain.

8. A device comprising:
wordline driver that provides a wordline signal to a wordline based on a row selection signal, a row clock signal and a switched power signal;
row selector logic that provides the row selection signal to the wordline driver based on first input signals in a periphery voltage domain; and
level shifter circuitry that provides the row clock signal to the wordline driver in a core voltage domain based on second input signals in the periphery voltage domain, wherein:
the level shifter circuitry further provides the switched power signal to a power connection of the wordline driver based on the second input signals,
the wordline driver includes first logic and second logic that are coupled in series and operate in the core voltage domain,
the first logic provides a complementary wordline signal to the second logic based on the row selection signal, the row clock signal, and the switched power signal, and
the second logic receives the complementary wordline signal from the first logic and provides the wordline signal to the wordline based on the complementary wordline signal.

9. The device of claim 8, wherein:
the wordline driver operates in the core voltage domain, and
the row selector logic operates in the periphery voltage domain.

10. The device of claim 9, wherein:
the level shifter circuitry has a bypass level shifter that is configured to operate as a level shifter based on a bypass signal in a first logic state, and
the bypass level shifter is also configured to operate as a clamp based on the bypass signal in a second logic state that is different than the first logic state.

11. The device of claim 10, wherein:
the level shifter circuitry includes a power-gated switch coupled between a core power supply and the power connection of the wordline driver, and
the power-gated switch is activated by an internal control signal that is provided by the bypass level shifter in the core voltage domain.

12. The device of claim 11, wherein:
the level shifter circuitry has input logic that operates in the periphery voltage domain,
the level shifter circuitry has output logic that operates in the core voltage domain, the input logic provides a row clock control signal to the bypass level shifter based on the second input signals,
the bypass level shifter provides a level-shifted control signal to the output logic in the core voltage domain based on the row clock control signal from the input logic and the bypass signal in the periphery voltage domain, and
the output logic provides the internal control signal to a gate of the power-gated switch in the core voltage domain based on the row clock control signal from the input logic in the periphery voltage domain and based on the level-shifted control signal from the bypass level shifter in the core voltage domain.

13. A device comprising:
wordline driver that provides a wordline signal to a wordline based on a row selection signal, a row clock signal, a wordline precharge signal and a wordline feedback signal;
row selector logic that provides the row selection signal to the wordline driver based on first input signals in a periphery voltage domain; and
level shifter circuitry that provides the row clock signal to the wordline driver in a core voltage domain based on second input signals in the periphery voltage domain, wherein:
the level shifter circuitry further provides the wordline precharge signal to a first power connection of the wordline driver based on the second input signals,
the wordline signal is fed back to a second power connection of the wordline driver as the wordline feedback signal,
the wordline driver includes first logic and second logic that are coupled in series and operate in the core voltage domain,
the first logic provides a complementary wordline signal to the second logic based on the row selection signal, the row clock signal, the wordline precharge signal and the wordline feedback signal, and
the second logic receives the complementary wordline signal from the first logic and provides the wordline signal to the wordline and provides the wordline feedback signal to the first logic based on the complementary wordline signal.

14. The device of claim 13, wherein:
the wordline driver operates in the core voltage domain, and
the row selector logic operates in the periphery voltage domain.

15. The device of claim 13, wherein:
a first power connection of the first logic refers to the first power connection of the wordline driver, and
a second power connection of the first logic refers to the second power connection of the wordline driver.

16. The device of claim 13, wherein:
the level shifter circuitry has a bypass level shifter that is configured to operate as a level shifter based on a bypass signal in a first logic state, and
the bypass level shifter is also configured to operate as a clamp based on the bypass signal in a second logic state that is different than the first logic state.

17. The device of claim 16, wherein:
the level shifter circuitry has input logic that operates in the periphery voltage domain,
the level shifter circuitry has output logic that operates in the core voltage domain,
the input logic provides a global timing pulse signal to the bypass level shifter based on the second input signals, the bypass level shifter provides a level-shifted precharge signal to the output logic in the core voltage domain based on the global timing pulse signal from the input logic and the bypass signal in the periphery voltage domain, and the output logic provides the wordline precharge signal to the first power connection of the wordline driver in the core voltage domain based on the level-shifted precharge signal in the core voltage domain.

* * * * *